US006316335B1

United States Patent
Takamori et al.

(10) Patent No.: US 6,316,335 B1
(45) Date of Patent: Nov. 13, 2001

(54) METHOD FOR FABRICATING SEMICONDUCTOR DEVICE

(75) Inventors: Yoshinori Takamori, Kyoto; Toru Nishiwaki, Toyama, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/419,007

(22) Filed: Oct. 13, 1999

(30) Foreign Application Priority Data

Oct. 19, 1998 (JP) .................................................. 10-296981

(51) Int. Cl.⁷ .................................................. H01L 21/306
(52) U.S. Cl. ........................... 438/471; 438/473; 438/472
(58) Field of Search .................................. 428/450, 449, 428/451; 438/21, 22, 471, 472, 473; 118/719, 730, 729, 725, 724; 219/405, 388, 390, 411

(56) References Cited

U.S. PATENT DOCUMENTS

| 3,885,993 |   | 5/1975  | Tihanyi .         |         |
|-----------|---|---------|-------------------|---------|
| 4,331,709 |   | 5/1982  | Risch et al. .    |         |
| 4,364,779 |   | 12/1982 | Kamgar et al. .   |         |
| 4,565,157 | * | 1/1986  | Brors et al. ..... | 118/719 |
| 4,851,295 | * | 7/1989  | Brors ............ | 428/450 |
| 4,851,358 | * | 7/1989  | Huber ............ | 437/10  |
| 4,868,133 | * | 9/1989  | Huber ............ | 437/10  |
| 5,314,848 | * | 5/1994  | Yasui et al. ..... | 437/248 |
| 5,444,217 | * | 8/1995  | Moore et al. ..... | 219/405 |
| 5,683,518 | * | 11/1997 | Moore et al. ..... | 118/730 |
| 6,114,222 | * | 9/2000  | Thakur ........... | 438/471 |
| 6,114,223 | * | 9/2000  | Gonzalez et al. .. | 437/473 |
| 6,146,980 | * | 11/2000 | Hsu .............. | 438/471 |
| 6,214,704 | * | 4/2001  | Xin .............. | 438/471 |

FOREIGN PATENT DOCUMENTS

| 0 481 777  | 4/1992 | (EP) . |
| 08 055858  | 6/1996 | (JP) . |
| WO 81 00487 | 2/1981 | (WO) . |

OTHER PUBLICATIONS

Japanese Patent Application Laid Open Gazette No. 1–276727 and an English abstract thereof.
Japanese Patent Application Laid Open Gazette No. 62–79628 and an English abstract thereof.

* cited by examiner

Primary Examiner—Charles Bowers
Assistant Examiner—Laura M. Schillinger
(74) Attorney, Agent, or Firm—Harness, Dickey & Pierce, P.L.C.

(57) ABSTRACT

Wafers, each including an MOS semiconductor component thereon, are introduced one by one into a single-wafer heat treatment system. First, hydrogen is introduced into the system and the wafer is heated up to a predetermined temperature in Step 1. Next, while the wafer temperature is kept constant at the predetermined temperature, the hydrogen sintering process is performed in Step 2. Then, the wafer is cooled down to another predetermined temperature or less within the system in Step 3. Finally, the wafer is taken out in Step 4. The time taken to perform a single cycle of the sintering process may be within three minutes. Accordingly, compared to a conventional process using a diffusion furnace, the throughput can be increased and the temperature response and uniformity of the wafer can also be improved. By taking the wafer out of the system after sintering and then cooling down it once, the damage caused in MOS interface states, for example, by a previous process step can be repaired in a short time.

4 Claims, 5 Drawing Sheets

METHOD FOR FABRICATING SEMICONDUCTOR DEVICE

BACKGROUND OF THE INVENTION

The present invention generally relates to a method for fabricating a semiconductor device, and more particularly relates to a hydrogen sintering process for making a processed object recover from process-induced damage.

A so-called "hydrogen sintering process", i.e., a heat treatment within hydrogen ambient, has been conducted to repair the damage caused in a gate oxide film, for example, by dry etching, metal film sputtering and so on during the fabrication process of a semiconductor device. Hereinafter, the conventional hydrogen sintering process will be described.

FIG. 7 is a cross-sectional view illustrating an exemplary semiconductor device, which is an object of a hydrogen sintering process. In FIG. 7, a part of a substrate, on which a second interlevel dielectric film 16 has been formed during a fabrication process of the semiconductor device with a tungsten plug structure, is illustrated. As shown in FIG. 7, an interlevel dielectric film 12 is formed between a diffused layer 11 within a silicon substrate 10 and an aluminum alloy interconnection layer 15. A contact hole is provided within the interlevel dielectric film 12 to electrically connect the aluminum alloy interconnection layer 15 to the diffused layer 11. A barrier metal layer 13, which is a stack of titanium and titanium nitride films or tantalum and tantalum nitride films, is formed on the inner faces of the contact hole and on the surrounding region of the interlevel dielectric film 12. The contact hole is filled in with a metal film of tungsten, for example, on the barrier metal layer 13, thereby forming a buried layer 14 with a plug structure. The second interlevel dielectric film 16 is further provided on the aluminum alloy interconnection layer 15 to form a second aluminum interconnection layer (not shown) over the layer 15.

Recently, such a tungsten plug structure, in which a contact hole provided within an interlevel dielectric film is filled in with tungsten as a contact member for connecting a pair of interconnection lines together or an interconnection line to an underlying substrate, is a very common structure.

In the conventional semiconductor device fabrication process, after the structure shown in FIG. 7 has been formed, a so-called hydrogen sintering process, i.e., a heat treatment within hydrogen ambient, is conducted. The sintering process is conducted to reduce a contact resistance between the barrier metal layer 13 and the diffused layer 11 or to repair the damage caused in a gate oxide film, for example, by dry etching or metal film sputtering for an MOS semiconductor device, in particular. In the conventional semiconductor device fabrication process, the hydrogen sintering process is conducted as a batch heat treatment by introducing several tens of semiconductor substrates (or wafers) at a time into a batch diffusion furnace made of a quartz tube, for example, and provided with a hydrogen gas supply line. Such a method of conducting hydrogen sintering on a great number of wafers at a time will be called a "batch hydrogen sintering process" for convenience. According to the conventional technique, the interface of the gate oxide film in an MOS transistor is allegedly stabilized by conducting the batch hydrogen sintering process.

If such a great number of wafers are sintered at a time within a thermal diffusion furnace according to the conventional hydrogen sintering technique, however, a very long time, e.g., about two and a half hours, is needed for single treatment cycle, and is far from being productively efficient. Generally speaking, the size of a single chip will be further increased from now on to catch up with the performance enhancement trend of a semiconductor integrated circuit. In addition, the size of a single wafer will also be further increased to cut out a greater number of semiconductor chips from a single wafer and thereby cut down the chip manufacturing cost.

Under the circumstances such as these, if such a wafer of a greater size is sintered with hydrogen in a batch thermal diffusion furnace as is done in the conventional method, then the distribution of temperatures within the wafer plane will get increasingly non-uniform. Accordingly, when the wafer is introduced into the furnace, various crystal lattice defects are more likely to be caused within the wafer due to the non-uniform temperature distribution within the wafer plane. Various countermeasures have been suggested to ensure sufficient response or uniformity for the temperature of the wafer being introduced into the furnace. For example, according to a proposed technique, a speed, at which a wafer-carrying boat is introduced into, or taken out of, the core of the furnace, is decreased intentionally. As an alternative, a process step of lowering the temperature at the core of the furnace is additionally provided before the wafer-carrying boat is introduced into, or taken out of, the core of the furnace. However, according to any of these techniques, the heat treatment should be conducted for an even longer time, and therefore, the productivity further declines.

SUMMARY OF THE INVENTION

An object of the present invention is providing a method for fabricating a semiconductor device exhibiting electrical characteristics at least comparable to those attained by the conventional process, while drastically shortening the time needed to conduct a heat treatment such as hydrogen sintering after the metallization process.

A method according to the present invention is adapted to fabricate a semiconductor device with a heat treatment conducted on a substrate, on which a semiconductor component has been formed and which is placed within a heat treatment system. The heat treatment includes the steps of: a) heating the substrate up to a processing temperature; b) keeping the temperature of the substrate at the processing temperature for a predetermined period of time within an ambient containing at least hydrogen; c) cooling down the substrate from the processing temperature after the step b) is finished; and d) taking the substrate out of the heat treatment system after the step c) is finished.

According to this method, the target of the hydrogen sintering process can recover from the damage, which has been caused in the target by a previous process step, in a shorter time. Thus, the hydrogen sintering process needs to be conducted for a shorter period of time for a characteristic value of a semiconductor component, such as a flat-band voltage of an MOS device, to recover its normal value. As a result, the throughput can be increased.

In one embodiment of the present invention, the number of substrates placed within the heat treatment system during a single cycle of the heat treatment is preferably three or less, and a time taken to perform the steps a) through d) of the heat treatment is preferably five minutes or less. In such an embodiment, the semiconductor component can recover its normal characteristics in a shorter time. In addition, since difference in temperature distribution between substrates or variation in temperature distribution within a single substrate can be reduced, the variation in characteristics of the semiconductor components can be suppressed.

In another embodiment, the diameter of the substrate is preferably eight inches or more. In such an embodiment, the hydrogen sintering method according to the present invention can afford to cope with the increase in diameter of a wafer.

In still another embodiment, the semiconductor component may be an MOS semiconductor component. In such an embodiment, an MOS semiconductor component with the flat-band voltage thereof recovered its normal value can be fabricated by conducting the hydrogen sintering process for a shorter period of time.

DESCRIPTION OF THE PREFERRED EMBODIMENTS

Hydrogen Sintering Processor

Figure 6:
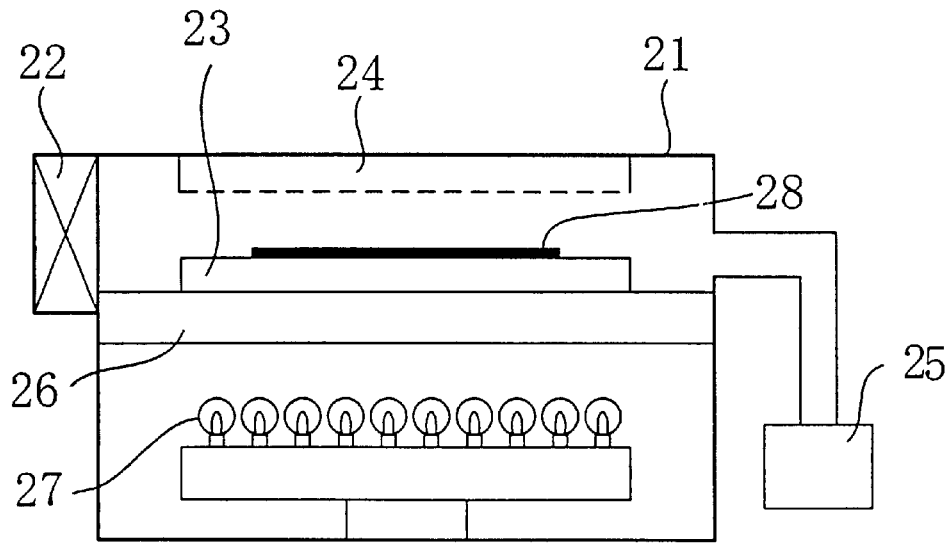
FIG. 6 is a cross-sectional view of a single-wafer hydrogen sintering processor according to an embodiment of the present invention.

Hereinafter, a method for fabricating a semiconductor device according to the present invention will be described in detail. FIG. 6 illustrates a hydrogen sintering processor according to an exemplary embodiment of the present invention. The processor includes a wafer processing chamber 21. The chamber 21 includes: a gate valve 22; a susceptor 23; a quartz window 26; a shower head 24; and a vacuum pump 25. A wafer 28 is transported into/out of the chamber 21 through the gate valve 22. The susceptor 23 directly supports the wafer 28 thereon to heat it. The quartz window 26 is provided under the susceptor 23. The shower head 24 supplies hydrogen inside the chamber 21. And the vacuum pump 25 produces and maintains vacuum inside the chamber 21. The susceptor 23 is heated by lamps 27 disposed under the quartz window 26. The temperature of the wafer 28 during the hydrogen sintering process is controlled by monitoring the temperature of the susceptor 23. The hydrogen sintering processor according to this embodiment is constructed in such a manner as to sinter the wafer 28 with hydrogen one by one as a matter of principle.

As can be seen, the processor for use in the hydrogen sintering process according to this embodiment is no different from a commercially available single-wafer CVD system of lamp-heating type. That is to say, in conducting the hydrogen sintering process according to the present invention (hereinafter, referred to as a "single-wafer hydrogen sintering process" for the illustrative purposes), no special members should be additionally provided for the conventional system shown in FIG. 6. Thus, the system used widely is applicable as it is.

Outline of Hydrogen Sintering Process

The hydrogen sintering process according to the present invention is intended not only to conduct heat treatment using a single-wafer processor, but also to change the wafer temperature during the process. Hereinafter, the detailed control procedure will be described.

Figure 1:
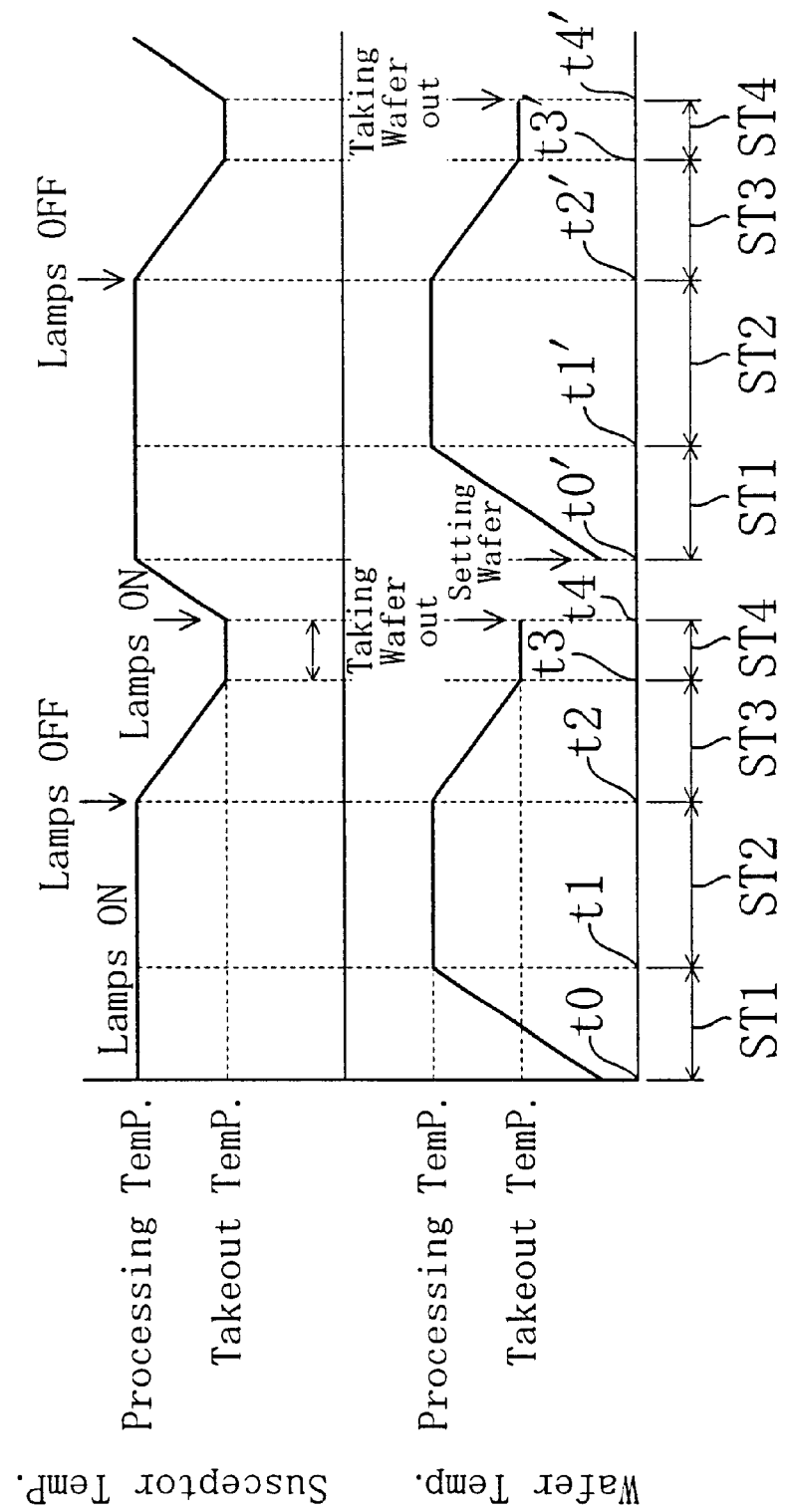
FIG. 1 is a timing diagram illustrating respective changes in susceptor and wafer temperatures with time during a single-wafer short-time hydrogen sintering process according to an exemplary embodiment of the present invention.

FIG. 1 is a timing diagram illustrating how the temperature of the susceptor is controlled during the single-wafer hydrogen sintering process according to the present invention and how the wafer temperature changes in accordance with the control. In FIG. 1, ST1, ST2, ST3 and ST4 denote the respective steps of raising the wafer temperature, sintering the wafer, lowering the wafer temperature and evacuating.

First, the steps to be performed prior to the process according to the present invention will be described briefly. In the processor shown in FIG. 6, the wafer 28, on which some semiconductor components such as MOS transistors are formed, is transported into the chamber 21 through the gate valve 22, and then the gate valve 22 is closed. To heat the wafer 28, the susceptor 23 has been heated in advance by the lamps 27 up to a desired temperature, e.g., about 400° C., at which the hydrogen sintering process should be carried out.

In Step ST1 of raising the wafer temperature, when the wafer 28, which has been transported into the chamber 21, is placed on the susceptor 23, the wafer 28 starts to be heated via the susceptor 23 at a time t0. Then, the shower head 24 supplies hydrogen at a flow rate of 0.5 slm to 5 slm inside the chamber 21, and the vacuum pump 25 controls the pressure inside the chamber 21 within the range from 100 Pa to 6000 Pa. Since the chamber 21 intended to process wafers one by one is relatively small in volume, the wafer temperature raising step ST1 can be performed in a shorter period of time as shown in FIG. 1. Although not shown in FIG. 1, when the wafer 28 is placed on the susceptor 23, the temperature of the susceptor 23 is affected by the temperature of the wafer 28 and slightly decreases. However, the temperatures of the wafer 28 and susceptor 23 are automatically controlled by the lamps 27 and then kept at about 400° C. at a time t1.

Next, in the sintering process step ST2, the flow rate of hydrogen supplied and the in-chamber pressure are kept at the same values within the range from 0.5 slm to 5 slm and the range from 100 Pa to 6000 Pa, respectively, as in Step ST1 until a time t2. In the illustrated embodiment, the total time taken to perform Steps ST1 and ST2 is about 1 minute.

Then, in the wafer temperature lowering step ST3, the lamps 27 are turned OFF at the time t2 and the wafer temperature is lowered to 350° C. or less by a time t3. Even during this Step ST3, the shower head 24 still keeps supplying hydrogen inside the chamber 21. According to the method of the present invention, a large quantity of hydrogen may be supplied inside the chamber 21 to cool the wafer 28 down in as short a time as possible. Step ST3 may be finished in about 50 seconds.

Subsequently, in the evacuating step ST4, the supply of hydrogen from the shower head 24 is stopped and hydrogen is exhausted out of the chamber 21 using the vacuum pump 25 to take the wafer 28 out of the chamber 21. During this Step ST4, the temperature of the susceptor 23 is kept at 350°

C. or less. Since the volume of the chamber 21 is small, Step ST4 can be finished in about 10 seconds (at a time t4).

Next, after Step ST4 is finished, the pressure inside the chamber 21 is reduced to the atmospheric pressure, the gate valve 22 is opened and then the wafer 28, which has been sintered with hydrogen, is taken out of the chamber 21. As soon as the wafer 28 is taken out, a next wafer to be processed is introduced into the chamber 21. In the meantime (i.e., after the processed wafer 28 was taken out and before the non-processed wafer is placed on the susceptor 23), the susceptor 23 is heated by the lamps 27. As a result, the temperature of the susceptor 23 is raised from 350° C. or less to the initially set, preferred temperature of about 400° C. at which the sintering process should be performed (by a time t0'). The interval between the times t4 and t0' can also be about 10 seconds.

Thereafter, the above Steps ST1 through ST4 are performed again in the interval between the times t0' and t4' to sinter the newly introduced wafer with hydrogen.

As described above, the time taken to finish processing a single wafer by hydrogen sintering is as short as about 2 minutes and 10 seconds. By repeatedly performing the series of process steps, a large number of wafers can be successively processed by hydrogen sintering. In the foregoing embodiment, the sintering temperature is defined at about 400° C. Alternatively, the temperature may be defined anywhere between 375° C. and 420° C. Also, the wafer is sintered with only hydrogen supplied. Optionally, a mixture of hydrogen and argon or nitrogen may also be used. Moreover, the wafer is heated by lamps according to this embodiment. Alternatively, a resistance heating technique may also be employed.

According to a conventional "batch hydrogen sintering process" using a diffusion furnace, about 50 wafers are ordinarily processable per batch in about two and a half hours. In contrast, according to the single wafer hydrogen sintering process, the processing time per wafer is about 2 minutes and 10 seconds. Thus, 50 wafers are processable in about 1 hour and 50 minutes. As a result, the processing time can be shortened compared to the conventional sintering process using a diffusion furnace.

In processing wafers one by one, even when a single heat treatment cycle is not so short as 2 minutes and 10 seconds, e.g., if the time is less than 3 minutes, the time taken to process 50 wafers is still shorter than the conventional batch sintering process using a diffusion furnace. As the case may be, the time per hydrogen sintering process can be set even longer, but is preferably within 5 minutes.

Also, since the hydrogen sintering processor according to this embodiment is intended to perform single-wafer processing, not the conventional batch process using a thermal diffusion furnace, lamp heating can be conducted in a short time as shown in FIG. 1. In such a case, since the wafer can be heated almost uniformly over the entire plane via the susceptor 23, the uniformity in temperature can be improved within the wafer plane. As a result, it is possible to prevent crystal lattice defects from being caused by the non-uniform temperature distribution. In addition, the temperature response of the wafer can also be improved.

Should the diameter of a wafer be further increased in the near future, the diameter of a quartz tube, which constitutes a batch diffusion furnace for processing such a largesized wafer, will have to be even more gigantic. Thus, in such a situation, it will be even more troublesome to provide adequate maintenance for the furnace, e.g., cleaning the quartz tube. In contrast, according to the method of this embodiment, such inconveniences can be avoided.

Results of Experiments on the Improvement of Characteristics of an MOS Semiconductor Device The present inventors carried out experiments to confirm how the characteristics of an MOS semiconductor device are improved by the inventive hydrogen sintering process. To repair damage, which was caused in an MOS semiconductor device during a previous process step, through a single-wafer hydrogen sintering process in a short time as in the present invention, more particularly, to attain as good characteristics as those obtained by the conventional batch sintering process, the wafer temperature while the wafer is being taken out of the chamber should be lower than the temperature during the sintering process as described in the foregoing embodiment. Such a technique was discovered by the present inventors. Hereinafter, the results of those experiments on the single wafer hydrogen sintering process will be described especially from this point.

In those experiments, we used an MOS diode formed on a silicon substrate as a sample to evaluate how much an MOS structure had recovered from the damage as a result of the inventive hydrogen sintering process. The sample had the following specific structure. In the following description, the sample used will be the same unless specifically stated otherwise.

Conductivity type of a substrate: n-type
Concentration of dopant: $5 \times 10^{15}/cm^2$
Thickness of gate oxide film: 9 nm
Gate electrode: $n^+$-type WSi polysilicon side gate
Total thickness of the gate electrode: 100 nm In this structure, an insulating film was deposited on the gate electrode and an opening was provided through the insulating film.

The following Table 1 shows the flat-band voltages of MOS diodes as defined based on the C-V (capacitance-bias voltage) characteristics thereof and the grain sizes of aluminum alloy layers for respective samples subjected to the hydrogen sintering processes under various conditions.

TABLE 1

|  | Sample 1 | Sample 2 | Sample 3 |
|---|---|---|---|
| Flat-band voltage (V) | −0.144 | −0.185 | −0.139 |
| Grain size (μm) | 2.6 | 0.7 | 2.7 |

In Table 1, Sample 1 is an MOS diode subjected to the single-wafer hydrogen sintering process according to the present invention under the conditions that the ambient was 100% hydrogen, the processing pressure was 1000 Pa, the wafer temperature during the sintering process was 400° C., the wafer takeout temperature was 350° C. and the respective intervals of Steps ST1, ST2, ST3 and ST4 shown in FIG. 1 were 30 seconds, 2 minutes and 30 seconds, 50 seconds and 10 seconds, respectively. Sample 2 is an MOS diode, which was also subjected to the single-wafer hydrogen sintering process under the same conditions as those for Sample 1, except that the wafer takeout temperature was 400° C. Sample 3 is an MOS diode subjected to the conventional batch hydrogen sintering process using a diffusion furnace under the conditions that the processing temperature was 400° C. and the processing time between the insertion and takeout of the wafers was about two and a half hours.

The following conclusion can be drawn from the results shown in Table 1.

Firstly, by performing the inventive single-wafer hydrogen sintering process in a short time, a flat-band voltage almost as high as that attained by the long-time batch hydrogen sintering process, which has heretofore been adopted for manufacturing, can be obtained. In the samples used for these experiments, the closer to zero the flat-band voltage was, the lower the density of interface states between the gate oxide film and the silicon substrate would be. In other words, as the flat-band voltage approximated zero, there would be lesser previous damage left as a result of the sintering process. Thus, it can be seen that damage can be repaired to a sufficient degree by the inventive method. In contrast, even if short-time single-wafer hydrogen sintering was performed in the same way except that the wafer takeout temperature was equal to the sintering temperature, the resultant flat-band voltage was almost no different from that of a sample not subjected to the hydrogen sintering process. That is to say, almost no damage recovery effects were attained in such a case. As can be seen, when a single-wafer hydrogen sintering process is performed in a short time, the wafer takeout temperature plays a key role in repairing the damage and stabilizing the characteristics of an MOS semiconductor device. It is well known that the hydrogen sintering process contributes to not only the performance enhancement of an MOS semiconductor device, but also the increase in current amplification factor of a bipolar transistor. In other words, these experimental results show that the flat-band voltage can be improved by the inventive short-time single-wafer hydrogen sintering process to almost the same degree as by the conventional long-time batch hydrogen sintering process. Accordingly, the current amplification factor of a bipolar transistor would also be increased according to the present invention. That is to say, if the density of interface states between the gate oxide film and the silicon substrate has been reduced, then a bipolar transistor would also be able to recover from the damage more easily. Thus, the present invention is effectively applicable to any semiconductor device other than the MOS types.

Secondly, according to the inventive short-time single-wafer hydrogen sintering process, the properties of interconnection lines can be approximately as good as those attained by the conventional long-time batch hydrogen sintering process that has heretofore been adopted for manufacturing. Table 1 also shows the grain sizes of aluminum alloy layers for the interconnection lines. In general, the hydrogen sintering process is applied not just to the damage recovery but also to setting the grain sizes constant in semiconductor devices of today. More specifically, this process is performed to enhance the resistance of an interconnection line to electromigration as much as possible and thereby to lengthen the life of the line.

The aluminum grain size was estimated using a sample with a different structure, in which an Al—Cu (0.5%) film had been deposited to be 0.4 $\mu$m thick on a thermal oxide film. The grain sizes shown in Table 1 were obtained by directly measuring an average diameter of the aluminum grains in accordance with an intercept method using a scanning electron microscope. According to the hydrogen sintering process of the present invention, aluminum grains can be grown to approximately the same size as the well-controlled one attained by the established long-time batch hydrogen sintering process. These results suggest that the aluminum alloy grains grow fast at a temperature around 400° C., and can be grown effectively even by the sintering process in as short as a couple of minutes.

Figure 2:
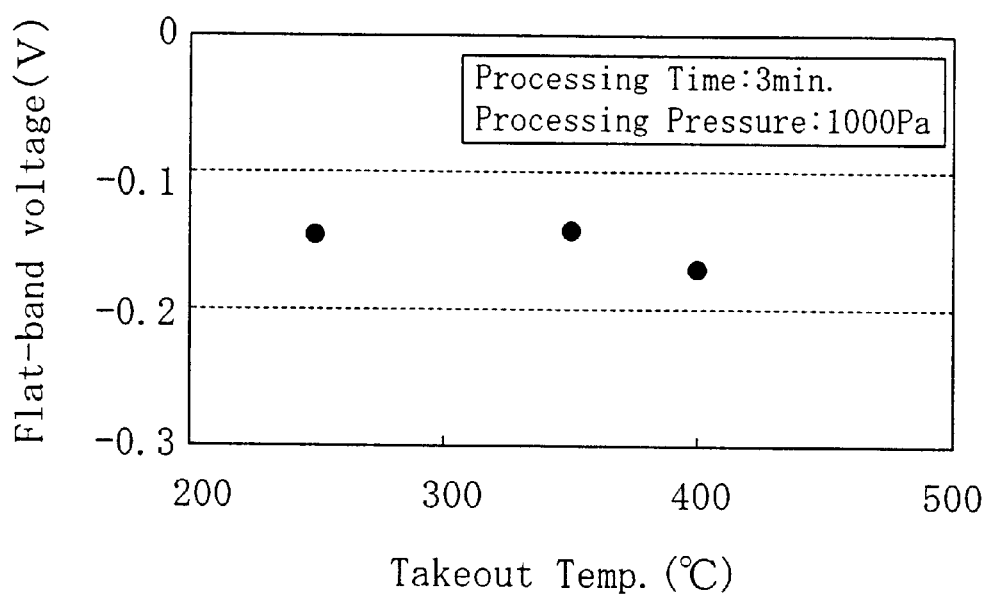
FIG. 2 is a graph illustrating a correlation between a wafer takeout temperature and a flat-band voltage during the hydrogen sintering process.

FIG. 2 illustrates the dependence of a flat-band voltage on the wafer takeout temperature for an MOS transistor that was subjected to a short-time single-wafer hydrogen sintering process according to this embodiment. In FIG. 2, the axis of abscissas represents the wafer takeout temperature, while the axis of ordinates represents the flat-band voltage. The single-wafer hydrogen sintering process was performed under the conditions that ambient was 100% hydrogen, processing pressure was 1000 Pa, temperature of the wafer during the sintering process was 400° C. and respective intervals of Steps ST1, ST2, ST3 and ST4 shown in FIG. 1 were 30 seconds, 2 minutes and 30 seconds, 50 seconds and 10 seconds, respectively. As shown in FIG. 2, if the wafer is taken out at the same temperature of 400° C. as the processing temperature without cooling the wafer down, the resulting flat-band voltage is almost the same as that of a sample not subjected to the hydrogen sintering process as described above. If the wafer is cooled down to 350° C., however, then the flat-band voltage can regain its normal value, which is almost equal to that attained by the long-time batch hydrogen sintering process, as shown in FIG. 2. It is not yet totally clear why and how these effects are attained, but it was at least confirmed that those effects are reproducible with sufficient probability. At present, the reason why these effects are attained is believed to be as follows. Hydrogen might combine with the interface states (caused by the damage) existing between the gate oxide film and the silicon substrate at the sintering temperature. But that hydrogen might be fixed at the interface and stabilized after the temperature has been cooled down during the takeout. FIG. 2 illustrates no data corresponding to the takeout temperatures lower than about 200° C. However, the flat-band voltage can effectively regain its normal value even when the takeout temperature is as low as around room temperature.

Figure 3:
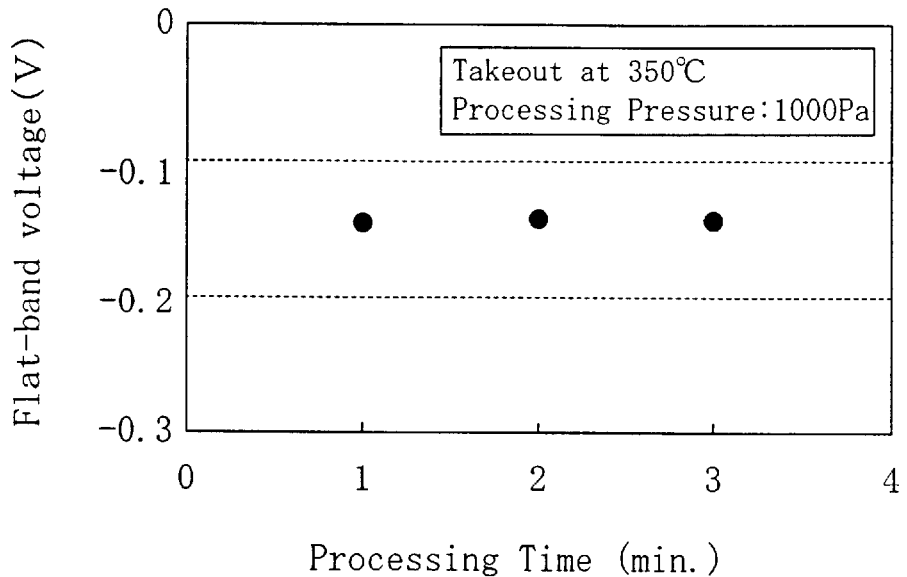
FIG. 3 is a graph illustrating a correlation between a processing time and a flat-band voltage during the hydrogen sintering process.
Figure 4:
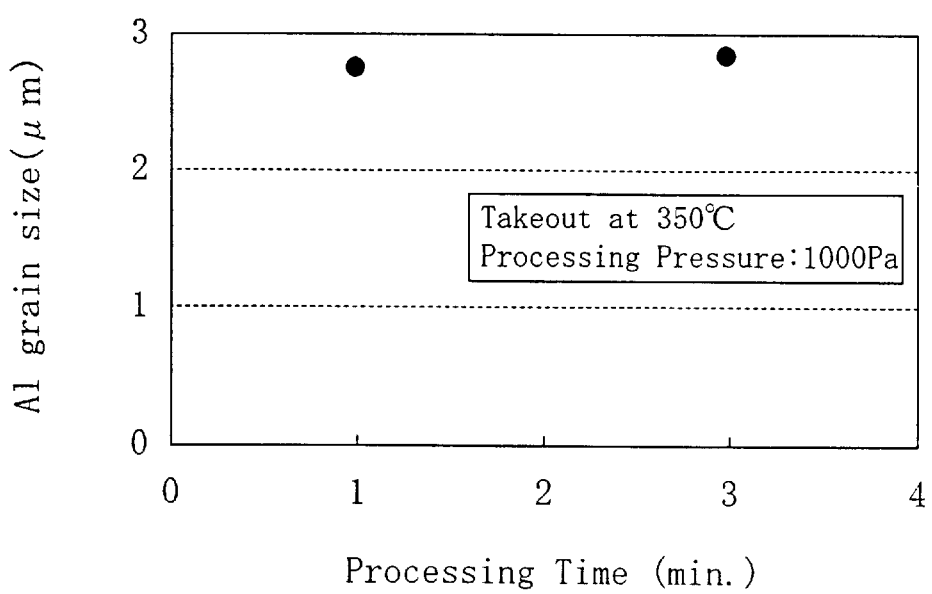
FIG. 4 is a graph illustrating a correlation between a processing time and the grain size of an aluminum alloy during the hydrogen sintering process.

FIG. 3 illustrates a correlation between a hydrogen sintering processing time and a flat-band voltage, while FIG. 4 illustrates a correlation between a hydrogen sintering processing time and the grain size of an aluminum alloy layer. In FIGS. 3 and 4, the axes of abscissas represent the processing time, while the axes of ordinates represent the flat-band voltage and the Al grain size, respectively. In the illustrated example, the processing time includes the respective periods of the wafer temperature raising step ST1 and the sintering processing step ST2 shown in FIG. 1. However, the period of Step ST1 is herein fixed at 30 seconds. The other conditions include: 100% hydrogen ambient; a processing pressure of 1000 Pa; a wafer processing temperature of 400° C.; and respective intervals of Steps ST3 and ST4 shown in FIG. 1 at 50 seconds and 10 seconds. As shown in FIG. 3, it takes about one minute of processing (i.e., a total time of Steps ST1 and ST2 shown in FIG. 1) to obtain a flat-band voltage substantially equal to that attained by the batch sintering process. The same effects are naturally attained if the processing time is longer than 1 minute. Accordingly, an appropriate processing time may be selected considering optimum throughput for the hydrogen sintering process. In the same way, only by performing the sintering process for just one minute, the aluminum grains can also be grown to substantially the same size as that attained by the conventional batch sintering process. That is to say, since the heat treatment is conducted for a very short time, the performance of the MOS diode is not adversely affected.

Figure 5:
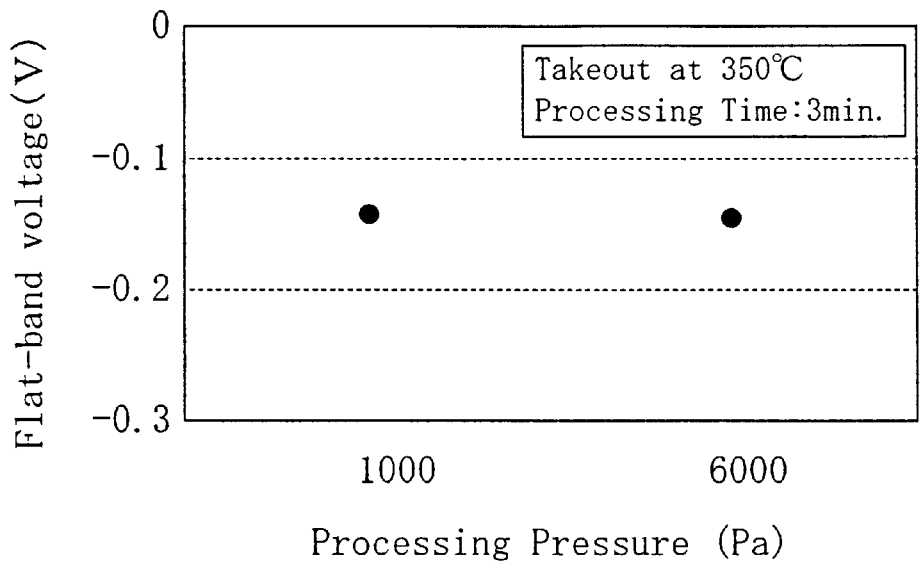
FIG. 5 is a graph illustrating a correlation between a processing pressure and a flat-band voltage during the hydrogen sintering process.

FIG. 5 illustrates a correlation between a processing pressure and a flat-band voltage in the single-wafer hydrogen sintering process according to this embodiment. In FIG. 5, the axis of abscissas represents the processing pressure inside the chamber, while the axis of ordinates represents the flat-band voltage. The single-wafer hydrogen sintering process was performed under the conditions that the ambient was 100% hydrogen, the wafer processing temperature was 400° C., the wafer takeout temperature was 350° C. and the respective intervals of Steps ST1, ST2, ST3 and ST4 shown in FIG. 1 were 30 seconds, 2 minutes and 30 seconds, 50 seconds and 10 seconds, respectively. As shown in FIG. 5, the flat-band voltage is not affected at all even if the processing pressure is changed from 1000 Pa into 6000 Pa. Accordingly, it can be seen that the single-wafer hydrogen sintering process may also be performed using a mixture of hydrogen and an inert gas, i.e., a gas obtained by decomposing ammonium. For example, the overall pressure may be defined at 6000 Pa while the partial pressure of hydrogen at 1000 Pa. That is to say, the hydrogen partial pressure has only to be 1000 Pa.

Figure 7:
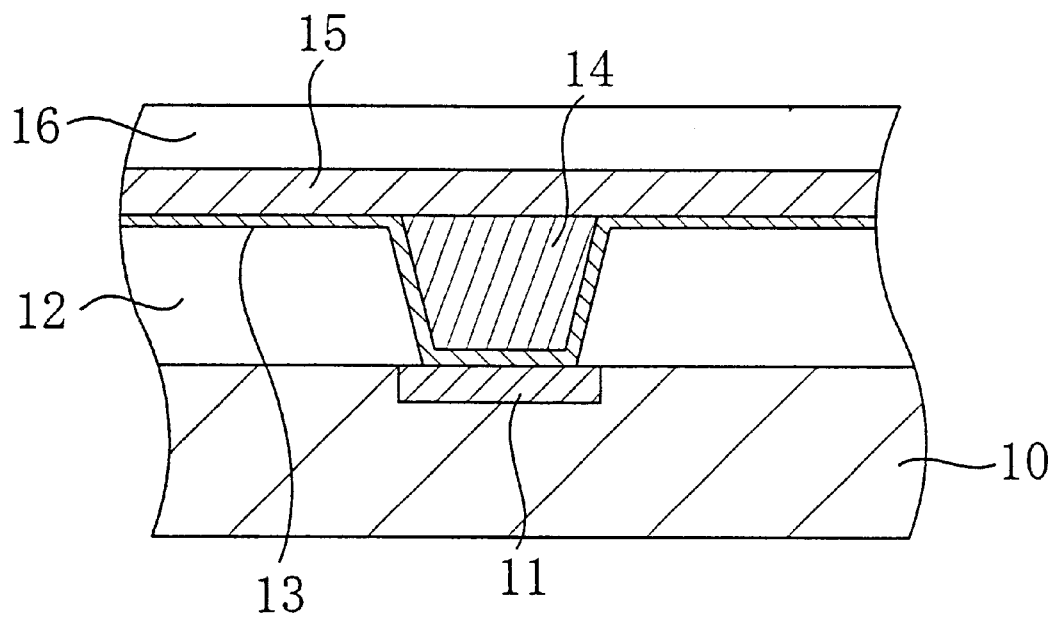
FIG. 7 is a cross-sectional view illustrating a contact portion of a multilevel interconnection structure, which is an exemplary target of a hydrogen sintering process.

Generally speaking, a hydrogen sintering process is expected to not only play the role described above, but also to reduce the contact resistance by reacting and alloying the barrier metal layer 13 with the diffused layer 11 in the silicon substrate 10 shown in FIG. 7. The latter alloying function might not be performed so satisfactorily by the inventive short-time single-wafer hydrogen sintering process as by the conventional long-time batch hydrogen sintering process. In a recent device with the structure shown in FIG. 7, however, the alloying process is likely to advance automatically if the device is kept at an elevated temperature (in the range from about 350° C. to about 400° C.) during the formation of the buried tungsten layer 14 by a CVD process or an overlying interlevel dielectric film. Thus, there is no problem even if the single-wafer hydrogen sintering process cannot contribute to the reduction in resistance of the barrier metal layer 13. Nevertheless, according to the present invention, it is naturally possible to conduct a heat treatment separately for the very purpose of reducing the resistance of the barrier metal layer 13.

Also, the short-time single-wafer hydrogen sintering process according to the present invention may be performed either every time each interconnection layer is formed or after the multi-level interconnection structure is completed.

In the foregoing embodiment, sintering for processing wafers on a one-by-one basis, i.e., placing a single wafer inside the chamber every time, has been described. Alternatively, the effects of the present invention are also attainable to a certain extent even when a plurality of wafers are placed inside the chamber at a time. The size, or the diameter, of a wafer will reach 8 inches or more soon and the volume of the chamber cannot be increased too much economically speaking. Considering these respects, not more than a couple of wafers are preferably placed at a time. In such a case, although the time taken to transport the wafers into/out of the chamber increases, the sintering processing time itself does not increase. Thus, the throughput can be advantageously increased compared to wafer-by-wafer processing.

At any rate, the method of the present invention is effectively applicable to a hydrogen sintering process for a large-sized wafer, which is expected to increase its diameter in the near future to 8 inches or more, more particularly, 300 to 400 mm.

What is claimed is:

1. A method for fabricating a semiconductor device comprising the step of conducting a heat treatment on a substrate, on which a semiconductor component has been formed and processing damage has been caused by the forming process due to a dry etching or sputtering process, and which is placed within a heat treatment system, the heat treatment comprising the steps of:

a) heating the substrate up to a processing temperature;

b) keeping the temperature of the substrate at the processing temperature for a predetermined period of time within an ambient containing at least hydrogen;

c) cooling down the temperature of the substrate to a temperature lower than the processing temperature in an ambient containing hydrogen after the step b) is finished; and d) taking the substrate out of the heat treatment system after the step c) is finished, wherein processing damage is removed by the process of step c).

2. The method of claim 1, wherein the number of substrates placed within the heat treatment system during a single cycle of the heat treatment is three or less, and wherein a time taken to perform the steps a) through d) of the heat treatment is five minutes or less.

3. The method of claim 1, wherein the diameter of the substrate is eight inches or more.

4. The method of claim 1, wherein the semiconductor component is an MOS semiconductor component.

\* \* \* \* \*